US010611509B2

(12) United States Patent
Busse et al.

(10) Patent No.: US 10,611,509 B2
(45) Date of Patent: Apr. 7, 2020

(54) SYSTEMS AND METHODS FOR FORMING AND LABELING CONTAINERS

(71) Applicant: Grupo Convermex, S.A. de C.V., Puebla (MX)

(72) Inventors: Charles E. Busse, Puebla (MX); Efrèn de Urquijo Carmona, Puebla (MX); Lawrence Maccherone, Puebla (MX)

(73) Assignee: Grupo Convermex, S.A. de C.V., Puebla (MX)

( * ) Notice: Subject to any disclaimer, the term of this patent is extended or adjusted under 35 U.S.C. 154(b) by 0 days.

(21) Appl. No.: 16/326,063

(22) PCT Filed: Aug. 16, 2017

(86) PCT No.: PCT/IB2017/054980
§ 371 (c)(1),
(2) Date: Feb. 15, 2019

(87) PCT Pub. No.: WO2018/033869
PCT Pub. Date: Feb. 22, 2018

(65) Prior Publication Data
US 2019/0185195 A1      Jun. 20, 2019

Related U.S. Application Data

(60) Provisional application No. 62/375,621, filed on Aug. 16, 2016.

(51) Int. Cl.
*B65C 9/04*      (2006.01)
*B65C 3/06*      (2006.01)
(Continued)

(52) U.S. Cl.
CPC .............. *B65C 9/04* (2013.01); *B29C 63/18* (2013.01); *B31B 50/024* (2017.08);
(Continued)

(58) Field of Classification Search
CPC ....... B29C 53/42; B29C 63/024; B29C 63/18; B29L 2031/7132; B65C 3/065;
(Continued)

(56) References Cited

U.S. PATENT DOCUMENTS 5,039,298 A * 8/1991 Takakusaki ......... B29C 49/2408
264/509
2004/0221944 A1* 11/2004 Havard ..................... B65C 3/16
156/230

(Continued)

OTHER PUBLICATIONS

Written Opinion for PCT/IB2017/054980.*

*Primary Examiner* — Sonya M Sengupta
(74) *Attorney, Agent, or Firm* — Haukaas Fortius PLLC; Michael H. Haukaas

(57) ABSTRACT

A system for labeling a container includes a label forming section, a buffer section, and a bonding section. The label forming section includes a first rotatable turret having a plurality of forming mandrels. The buffer section includes a second rotatable turret having a plurality of buffer receptacles. The bonding section includes a third rotatable turret having a plurality of bonding stations. The label forming section forms a label in a frustoconical shape using one of the forming mandrels and transfers the label to one of the buffer receptacles of the buffer section. The buffer section receives, in a buffer receptacle, the label followed by a container blank, and transfers the label and the container blank together to one of the bonding stations of the bonding section. The bonding section bonds the label to the container blank in the bonding station.

20 Claims, 5 Drawing Sheets

(51) Int. Cl.

| | |
|---|---|
| *B29C 63/18* | (2006.01) |
| *B31B 50/02* | (2017.01) |
| *B31B 50/06* | (2017.01) |
| *B65B 11/30* | (2006.01) |
| *B31B 50/07* | (2017.01) |
| *B65C 9/10* | (2006.01) |
| *B65C 9/22* | (2006.01) |
| *B65C 9/24* | (2006.01) |
| *B65C 9/28* | (2006.01) |
| *B65D 25/20* | (2006.01) |
| *G09F 3/04* | (2006.01) |
| *B29L 31/00* | (2006.01) |
| *B29C 53/42* | (2006.01) |
| *B65C 9/12* | (2006.01) |
| *B65D 25/36* | (2006.01) |
| *B65D 25/34* | (2006.01) |
| *B31B 110/20* | (2017.01) |

(52) U.S. Cl.
CPC .......... *B31B 50/062* (2017.08); *B31B 50/07* (2017.08); *B65B 11/30* (2013.01); *B65C 3/065* (2013.01); *B65C 9/10* (2013.01); *B65C 9/22* (2013.01); *B65C 9/24* (2013.01); *B65C 9/28* (2013.01); *B65D 25/205* (2013.01); *G09F 3/04* (2013.01); *B29C 53/42* (2013.01); *B29L 2031/7132* (2013.01); *B31B 2110/20* (2017.08); *B65C 9/12* (2013.01); *B65D 25/34* (2013.01); *B65D 25/36* (2013.01)

(58) Field of Classification Search
CPC .... B65C 9/04; B65C 9/10; B65C 9/12; B65C 9/22; B65C 9/24; B65C 9/28; B65D 25/205; B65D 25/34; B65D 25/36; G09F 3/04; H01L 21/02; B31B 2105/0022; B31B 2110/20; B31B 2120/501; B31B 50/024; B31B 50/062; B31B 50/07; B65B 11/30
USPC ................................ 156/196, 235, 446, 540
See application file for complete search history.

(56) References Cited

U.S. PATENT DOCUMENTS

| | | | |
|---|---|---|---|
| 2009/0229221 A1* | 9/2009 | Dart ....................... | B65D 1/265 53/203 |
| 2012/0247682 A1* | 10/2012 | Leykamm ................ | B65C 3/14 156/556 |
| 2014/0069582 A1* | 3/2014 | Alvarez ................ | B29C 44/14 156/308.2 |
| 2014/0338838 A1* | 11/2014 | Stamatiou .............. | B32B 27/10 156/475 |

* cited by examiner

SYSTEMS AND METHODS FOR FORMING AND LABELING CONTAINERS

RELATED APPLICATIONS

This application is a National Stage filing under 35 U.S.C § 371 of International Application No. PCT/IB2017/054980 filed Aug. 16, 2017 . which claims priority under 35 U.S.C. § 119(e) to U.S. Provisional Patent Application No. 62/375, 621, filed Aug. 16,2016, which applications are incorporated herein by reference.

BACKGROUND

This present disclosure relates to labeling systems. In particular, the present disclosure relates to systems and methods for labeling cups or other frusto-conical containers.

In a cup labeling systems, three or more separate machines may be used to perform the various steps in the labeling process. For example, a first machine (e.g., a label forming machine) is used to form individual labels, which are stacked together to produce a label stack having a predetermined number of formed labels. At the same time, a second machine (e.g., a cup forming machine) is used to form individual cup blanks. Like the labels, the formed cup blanks are stacked together to form a cup stack, which preferably matches the number of labels in the label stack. Both the label stack and the cup stack are then moved to a third machine. The labels in the label stack and cup blanks in the cup stack are both individually fed into the third machine (e.g., a labeling machine) to bond the label to the cup blank to produce a labeled cup.

As the labeling system described above involves the use of multiple machines, a number of inefficiencies are introduced into the system. For example, because the label stack and the cup stack must be moved from their respective forming machines to the labeling machine, handling time and labor costs are increased. Moreover, the labeling machine must operate on a start-and-stop process due to the individual cup labeling process and to allow for the changeover of the label stack and the cup stack from the forming machines to the labeling machine. Finally, in order to ensure that cup blanks are precisely matched with labels, register points must be established between the components during the labeling process.

SUMMARY

In certain embodiments, a system for labeling a container includes a label forming section comprising a first rotatable turret that includes a plurality of forming mandrels, a buffer section comprising a second rotatable turret that includes a plurality of buffer receptacles, and a bonding section comprising a third rotatable turret that includes a plurality of bonding stations. The label forming section is configured to form a label in a frustoconical shape using one of the plurality of forming mandrels, and transfer the label to one of the buffer receptacles of the buffer section. The buffer section is configured to receive, in said one of the buffer receptacles, the label followed by a container blank, and transfer the label and the container blank together to one of the bonding stations of the bonding section. The bonding section is configured to bond the label to the container blank in said one of the bonding stations.

In one aspect, the second rotatable turret rotates about an axis that is perpendicular to an axis of rotation of the first rotatable turret.

In one aspect, the second rotatable turret rotates about an axis that is perpendicular to an axis of rotation of the third rotatable turret.

In one aspect, the first rotatable turret and the second rotatable turret are configured for indexed rotation.

In one aspect, the third rotatable turret is configured for a constant speed rotation.

In one aspect, the number of forming mandrels is equal to the number of buffer receptacles.

In one aspect, the number of bonding stations is greater than the number of forming mandrels and the number of buffer receptacles.

In one aspect, the label forming section further comprises a label feeding station configured to receive and hold the label prior to forming, and a label conveying station configured to move the label from the label feeding station to the first rotatable turret.

In one aspect, the label conveying station comprises a rotatable conveying mechanism configured to rotate a plurality of arms and a linear conveying mechanism. The plurality of arms are configured to move the label from the label feeding station to the linear conveying mechanism, and the linear conveying mechanism is configured to move the label to the first rotatable turret.

In one aspect, the linear conveying mechanism comprises folding arms configured to fold the label onto said one of the forming mandrels.

In one aspect, the first rotatable turret comprises an air mechanism configured to provide a burst of air to transfer the label to said one of the buffer receptacles.

In one aspect, the second rotatable turret comprises an air mechanism configured to provide a burst of air to transfer the label and the container blank together to said one of the bonding stations.

In one aspect, each of the plurality of bonding stations comprises a container-receiving mandrel configured to receive the label and the container blank, and a bonding receptacle configured to mate with the container-receiving mandrel having the label and the container blank.

In one aspect, the bonding receptacle is configured to heat the container-receiving mandrel having the label and the container blank to bond the label to the container blank.

In one aspect, the bonding receptacle is configured to receive hot oil from a hot oil manifold to bond the label to the container blank.

In certain embodiments, a method for labeling a container includes providing a label to a label forming section comprising a first rotatable turret that includes a plurality of forming mandrels, forming the label in a frustoconical shape using one of the plurality of forming mandrels, transferring the label to a buffer section comprising a second rotatable turret that includes a plurality of buffer receptacles, providing a container blank to one of the buffer receptacles of the buffer section having the label provided therein, transferring the label and the container blank together to a bonding section comprising a third rotatable that includes a plurality of bonding stations, and bonding the label to the container blank in one of the bonding stations.

In one aspect, the step of transferring the label to the buffer section comprises providing a burst of air to the label.

In one aspect, the step of transferring the label to the bonding section comprises providing a burst of air to the label and the container blank.

In one aspect, the step of forming the label comprises folding the label around said one of the plurality of forming mandrels such that ends of the label overlap at an overlapping portion, and sealing the label at the overlapping portion.

In one aspect, the step of bonding the label to the container blank comprises heating the label and the container blank in said one of the bonding stations.

In one aspect, a labeled container is formed the method.

In one aspect, the labeled container is a cup.

DETAILED DESCRIPTION

The present disclosure relates to an integrated system for labeling cups or other frusto-conical containers. The system combines the label forming process and the cup labeling or bonding process into a single, continuous motion machine, allowing for higher output and a more efficient and cost-effective labeling process. In certain embodiments, the system described below may be used to produce labeled, plastic foam containers, such as labeled expanded polystyrene (EPS) cups. However, the system is not limited to EPS cups and instead may be used to label other types of frusto-conical containers.

Figure 1:
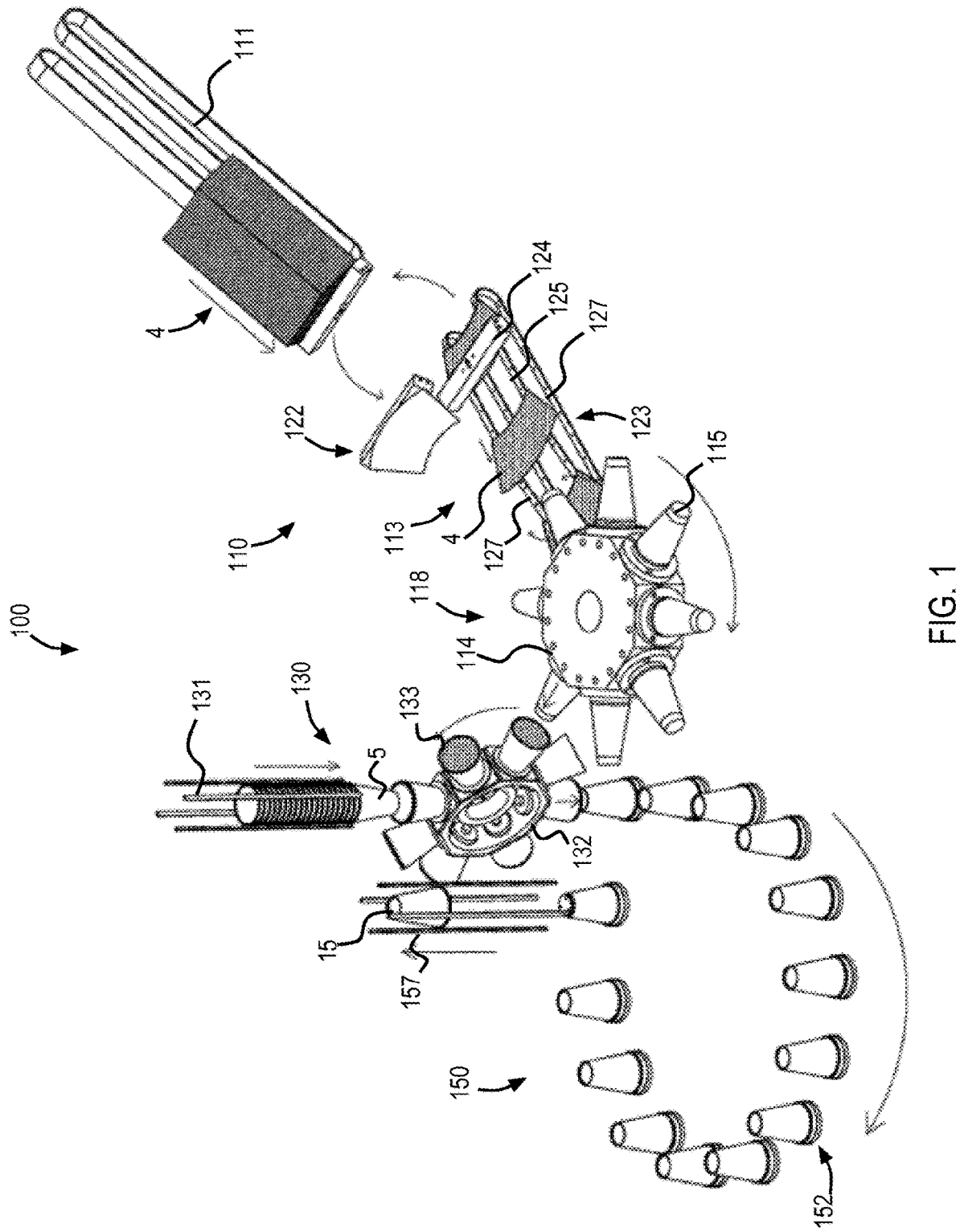
FIG. 1 is a schematic perspective view of a labeling system according to one embodiment of the present invention.
Figure 2:
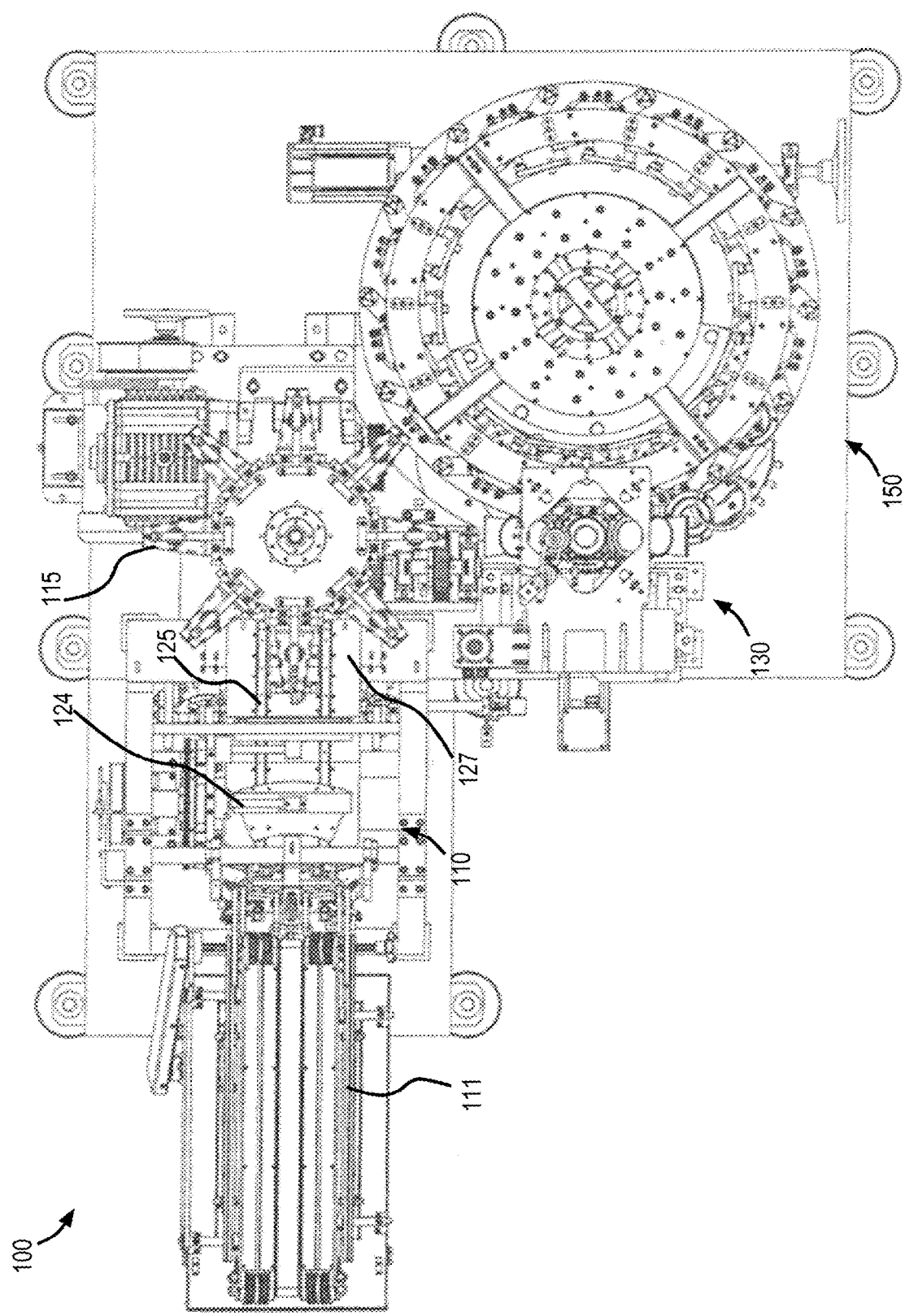
FIG. 2 is a schematic plan view of the labeling system of FIG. 1.

FIGS. 1 and 2 show a system 100 for labeling a container product, such as a cup, according to one embodiment of the present invention. As shown in FIGS. 1 and 2, the system 100 includes a label forming section 110, a buffer section 130, and a bonding section 150.

The label forming section 110 is configured to receive a pre-formed label and form the label into, for example, a frusto-conical shape. As shown in FIG. 1, the label forming section 110 includes a label feeding station 111, a label conveying station 113, and a label forming station 118.

Figure 3:
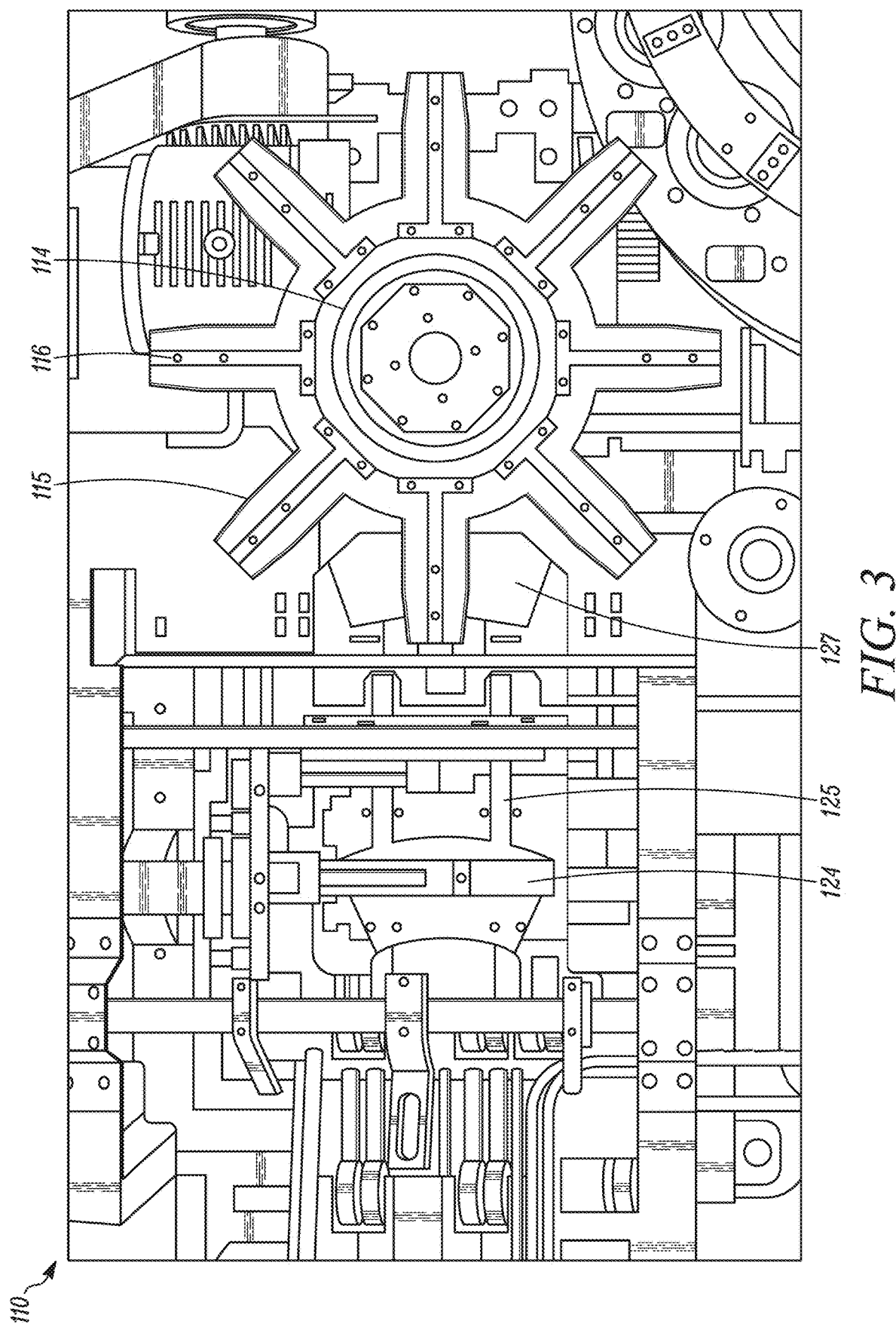
FIG. 3 is a detailed view of a label forming section of the labeling system of FIG. 1.

The label feeding station 111 is configured to receive and hold a plurality of flat, pre-formed labels 4 for the labeling process. The label feeding station 111 is sized and shaped according to the shape of the pre-formed labels 4 such that the pre-formed labels 4 are held in a precise position before being moved to the label conveying station 113. The label conveying station 113 is configured to move the pre-formed labels 4 from the label feeding station 111 to the label forming station 118. As shown in FIGS. 1-3, the label conveying station 113 includes a rotatable conveying mechanism 122 and a linear conveying mechanism 123, which operate to move the pre-formed labels 4 from the label feeding station 111 to the label forming station 118.

The rotatable conveying mechanism 122 rotates a plurality of arms 124 about an axis. As one of the plurality of arms 124 passes the label feeding station, the arm 124 is configured to move a pre-formed label 4 from the label feeding station 111 and place it on the linear conveying mechanism 123. In certain embodiments, the plurality of arms 124 are configured as vacuum conveyors that apply a suction force to the pre-formed label 4 in the label feeding station 111 as the arm 124 approaches the label feeding station 111 and release the suction force as the arm 124 approaches the linear conveying mechanism 123. In addition, in some embodiments, the rotatable conveying mechanism 122 is driven by a servomotor for precise, indexed movement of the plurality of arms 124 relative to the label feeding station 111 and the linear conveying mechanism 123.

Figure 4A:
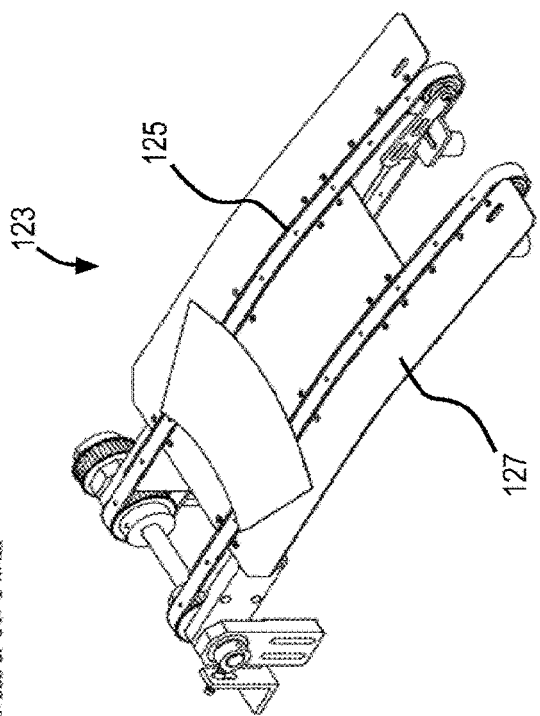
FIGS. 4A-4C are detailed views of a linear conveying mechanism for the label forming station of FIG. 3.
Figure 4C:
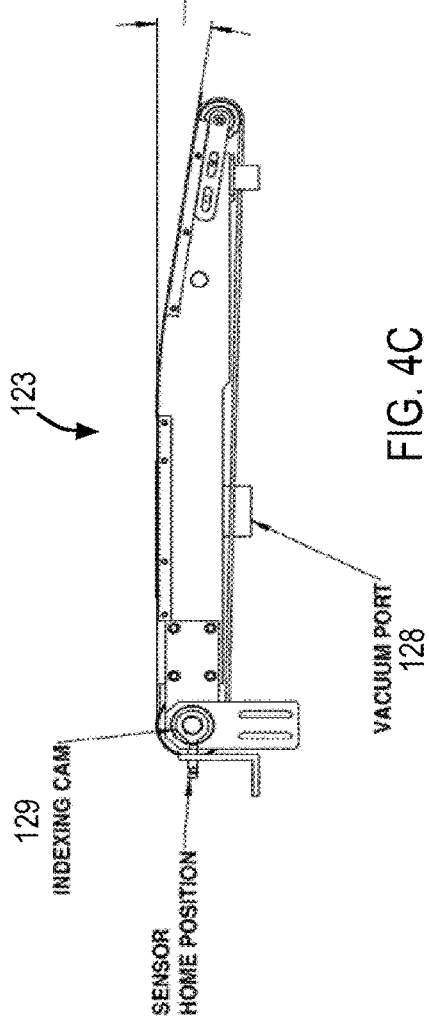
Figure 4B:
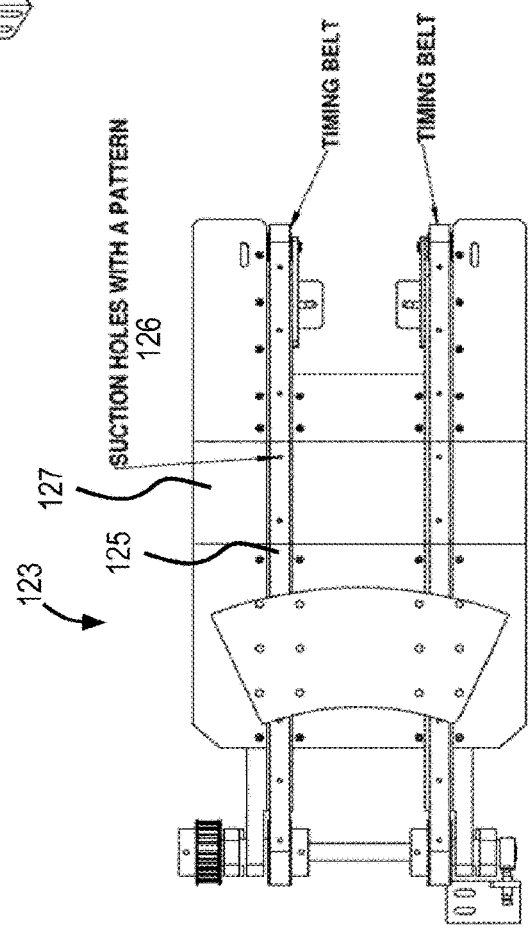

The linear conveying mechanism 123 includes a conveying guide 125 and folding arms 127. As further shown in FIGS. 4A-4C, the conveying guide 125 may include a conveyor belt that is configured to provide a vacuum pressure to the label 4 as it is moved from the label feeding station 111 to the label forming station 118. For example, as shown in FIG. 4B, the conveying guide 125 may include a plurality of suction holes 126 connected to a vacuum port 128 (shown in FIG. 4C). The suction holes 126 are provided such that a suction force is applied to both ends of the label 4 as it is moved along the linear conveying mechanism 123. Depending on the size and shape of the label fed into the system 100, the transverse spacing between the suction holes 125 may be adjusted (decreased or increased) so that an optimal suction force is applied to the label during movement. In certain embodiments, the conveying guide 125 is driven by a servomotor or indexing cam 129 for indexed movement of the belt (described in more detail below) as the labels 4 are placed on the conveying guide 125. In yet other embodiments, the conveying guide 125 further includes a timing belt configured to move the labels 4 to a stop position at the label forming station 118.

The folding arms 127 are positioned such that when the conveying guide 125 conveys a pre-formed label 4 to the label forming station 118, outer ends of the label 4 are positioned above the folding arms 127 to allow for the formation of the label 4 at the label forming station 118, as described below. In addition, as shown in FIG. 4C, the conveying guide 125 is configured to angle downward toward one end. The angle is set to match the angle of the walls of the forming mandrels 115 (described below) of the label forming station 118. Depending on the type of container being labeled by the system 100, the angle of the conveying guide 125 may be adjusted to match the forming mandrels being used to form the particular label.

As shown in FIGS. 1-3, the label forming station 118 includes a first rotatable turret 114 having a plurality of forming mandrels 115 that are configured to form the label 4 in a frusto-conical shape. To form the pre-formed labels 4, the folding arms 127 may be configured to act as a clamp by folding the outer ends of the label 4 around a forming mandrel 115 and holding the label 4 to the mandrel 115. The forming mandrel 115 may also be provided with a vacuum system configured to provide a suction force to the label 4 such that the outer ends of the label 4 are pulled onto mandrel 4 to overlap with one another at an overlapping portion. As shown in FIG. 3, a sealing arm 116, positioned above the mandrel 115, moves downward to seal or adhere the overlapping portion of the label 4 by, for example, applying heat to the label 4 to form a seam along the length of the overlapping portion. In certain embodiments, the forming mandrels 115 may be provided with a cooling system configured to provide cool liquid to the mandrels 115 to avoid overheating of the mandrels 115.

Once the label 4 is formed onto the forming mandrel 115, the first rotatable turret 114 rotates to transfer the formed label 4 to the buffer section 130.

The buffer section 130 includes a blank feeding section 131 and a second rotatable turret 132 having a plurality of buffer receptacles 133. As shown in FIG. 1, in certain embodiments, the second rotatable turret 132 rotates about an axis that is perpendicular to an axis of rotation of the first rotatable turret 114. In addition, in certain embodiments, the first rotatable turret 114 and the second rotatable turret 132 are both configured as indexing turrets (i.e., for indexed rotation) having the same number of individual stations (e.g., eight forming mandrels 115 on the first rotatable turret 114 and eight buffer receptacles 133 on the second rotatable turret 132, as shown in FIG. 1). By indexing the turrets 114, 132 relative to one another, precise matching of the formed label 4 to a container blank, such as a cup blank 5, is achieved. The position of the second rotatable turret 132 and its axis of rotation may be adjusted relative to the position and axis of rotation of the first rotatable turret 114. In adjusting the relative positions of the first and second rotatable turrets 114, 132, the indexing transmission, which guides the indexed movements of the turrets 114, 132, and the pulley transmission, which mechanically moves the turrets 114, 132, may need to be adjusted accordingly.

When a buffer receptacle 133 is aligned with a forming mandrel 115 having a formed label 4, the label forming section 110 transfers the formed label 4 to the buffer receptacle 133. In certain embodiments, the first rotatable turret 114 includes an air mechanism (e.g., an air jet) that provides a burst of air to transfer the formed label 4 from the forming mandrel 115 to the buffer receptacle 133. In other embodiments, a transfer belt may be provided between the first rotatable turret 114 and the second rotatable turret 132 to aid in the transfer of the formed label 4 to the buffer receptacle 133. After transfer of the formed label 4, the second rotatable turret 132 then rotates the buffer receptacle 133 to the blank feeding section 131, where the blank feeding section 131 provides a container blank, such as a cup blank 5, into the buffer receptacle 133. The second rotatable turret 132 continues to rotate to transfer the label and the cup blank together to the bonding section 150.

Figure 5:
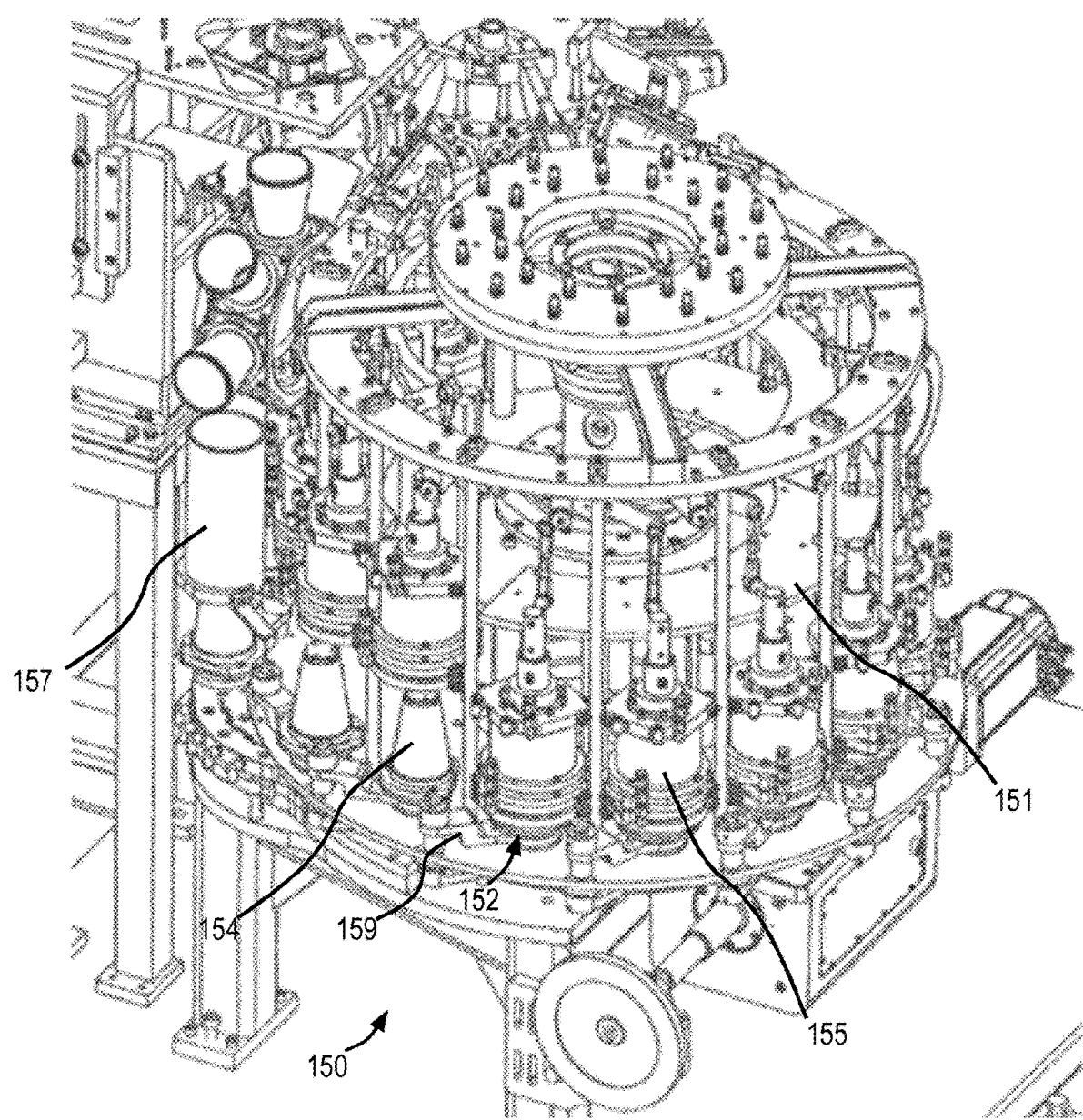
FIG. 5 is a detailed view of a bonding section of the labeling system of FIG. 1.

As shown in FIG. 5, the bonding section 150 includes a third rotatable turret 151 that includes a plurality of bonding stations 152. As shown in FIG. 2, the third rotatable turret 151 rotates about an axis that is perpendicular to the axis of rotation of the second rotatable turret 132 (or parallel to the axis of rotation of the first rotatable turret 111). In certain embodiments, the third rotatable turret 151 is configured to rotate at a constant speed. In addition, as shown in FIG. 1, the third rotatable turret 151 may include a number of bonding stations 152 (e.g., fourteen) that is greater than the number of buffer receptacles 133 and/or forming mandrels 115 to allow for a higher output of labeled cups during the bonding process.

As shown in FIG. 5, each of the bonding stations 152 includes a cup-receiving mandrel 154, in the form of a male mold, and a bonding receptacle 155, in the form of a female mold that is configured to mate with the male mold of the cup-receiving mandrel 154. The cup-receiving mandrel 154 may be provided on a swing arm 159, which moves the cup-receiving mandrel 154 radially out from the third rotatable turret 151 at certain points during the rotation of the turret by, for example, cam actuation. For example, as a cup-receiving mandrel 154 is rotated toward the buffer section 130, the bonding receptacle 155 is moved to a position above the cup-receiving mandrel 154 and the cup-receiving mandrel 154 is then moved in a radially outward from the third rotatable turret 151 by the swing arm 159 such that the cup-receiving mandrel 154 is aligned with a buffer receptacle 133. The buffer receptacle 133 then transfers the label and cup blank to the cup-receiving mandrel 154, which may be accomplished by an air mechanism (e.g., an air jet) provided on the second rotatable turret 132. As the third rotatable turret 151 continues to rotate, the swing arm 159 may be configured to rotate the cup-receiving mandrel 154 radially inward to re-align with the bonding receptacle 155, which then moves downward to mate with the cup-receiving mandrel 154. In some embodiments, the cup-receiving mandrel 154 can also be configured to move axially relative to the bonding receptacle 155 to allow for self-alignment of the cup-receiving mandrel 154 to the bonding receptacle 155 during mating.

When mated with the cup-receiving mandrel 154, the bonding receptacle 155 is configured to bond the label to the cup blank to produce a labeled cup 15. In certain embodiments, the bonding receptacle 155 applies heat to the cup-receiving mandrel 154 to bond the label 4 to the cup blank 5. For example, each of the bonding receptacles 155 may be connected to a hot oil manifold configured to distribute hot oil to the bonding receptacles 155 to apply heat to the cup-receiving mandrels 154.

Once the label 4 is bonded to the cup blank 5, the bonding receptacle 155 moves upward to separate from the cup-receiving mandrel 154. The cup-receiving mandrel 154 then continues to rotate to a conveyance tube 157 (e.g., a vacuum tube), which is configured to transfer the labeled cup 10 provided on the cup-receiving mandrel 154 from the system 100. When approaching the conveyance tube 157, the cup-receiving mandrel 154 may be configured to rotate radially outward from the third rotatable turret 151 by the swing arm in order to align with the conveyance tube 157. To aid in the transfer of the labeled cup 10 from the cup-receiving mandrel 154 to the conveyance tube 157, the cup-receiving mandrel 154 may include an air mechanism (e.g., an air jet) that provides a burst of air to move the labeled cup 15 from the cup-receiving mandrel 154 into the conveyance tube 157.

As noted above, each of the stations 110, 130, 150 are configured for precise indexed movement to ensure reliable label-to-blank matching. In certain embodiments, movement of the components of the stations 110, 130, 150 are each detected by an encoder having a cam connected to a sensor, which communicates the detected movement of the given component to a controller. One of the encoders may be configured as a master encoder that detects movement of an indexing transmission, which serves as the master movement for the system. The other encoders (slave encoders) detect corresponding slave movements of the components of the stations 110, 130, 150. The controller may then receive signals from the slave encoders and pair the signals to the signal received from the master encoder to ensure synchronous movement between the components of the system 100.

For example, in certain embodiments, a master encoder having an indexing cam connected to a sensor is mounted to a main shaft of the indexing transmission, which may positioned underneath the folding arms 127 of the linear conveying mechanism 123. The master encoder follows movement of the main shaft and sends a signal of the master movement to the controller. An additional seven encoders are mounted to various components to detect the corresponding slave movements. In particular, slave encoders are placed on the rotatable conveying mechanism 122, the conveying guide 125, the first rotatable turret 114, the second rotatable turret 132, the blank feeding section 131, a third rotatable turret 151, and a taper. The encoders may be configured to detect indexed movement of the components (e.g., the conveying guide 125, the first rotatable turret 114, the second rotatable turret 132, the blank feeding section 131, and the taper) or follow the continuous movement of the components (e.g., the rotatable conveying mechanism 122 and the third rotatable turret 151).

The system 100 described above provides for a simplified and integrated labeling process in the production of labeled cups. By integrating the label forming process with the bonding process using a single, continuous motion machine, higher speeds and higher output (e.g., 120 cups/minute) in forming labeled cups compared to conventional labeling systems may be achieved. In addition, the integrated system requires less labor and less handling time to produce the final product than conventional systems. Moreover, a single machine allows for the precise control of the labeling process, which, in turn, allows the label and cup blanks to remain in automatic register with one another, improving overall product quality and resulting in less in-process scrap.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the Figures. It should be noted that the orientation of various elements may differ according to other exemplary embodiments, and that such variations are intended to be encompassed by the present disclosure.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present invention. For example, the heat recovery heat exchangers may be further optimized.

What is claimed is:

1. A system for labeling a container, the system comprising:
    a label forming section comprising a first rotatable turret that includes a plurality of forming mandrels;
    a buffer section comprising a second rotatable turret that includes a plurality of buffer receptacles;
    a bonding section comprising a third rotatable turret that includes a plurality of bonding stations,
    wherein the label forming section is configured to form a label in a frustoconical shape using one of the plurality of forming mandrels, and transfer the label to one of the buffer receptacles of the buffer section,
    wherein the buffer section is configured to receive, in said one of the buffer receptacles, the label followed by a container blank, and transfer the label and the container blank together to one of the bonding stations of the bonding section, and
    wherein the bonding section is configured to bond the label to the container blank in said one of the bonding stations.

2. The system of claim 1, wherein the second rotatable turret rotates about an axis that is perpendicular to an axis of rotation of the first rotatable turret.

3. The system of claim 1, wherein the second rotatable turret rotates about an axis that is perpendicular to an axis of rotation of the third rotatable turret.

4. The system of claim 1, wherein the first rotatable turret and the second rotatable turret are configured for indexed rotation.

5. The system of claim 1, wherein the third rotatable turret is configured for a constant speed rotation.

6. The system of claim 1, wherein the number of forming mandrels is equal to the number of buffer receptacles.

7. The system of claim 1, wherein the number of bonding stations is greater than the number of forming mandrels and the number of buffer receptacles.

8. The system of claim 1, wherein the label forming section further comprises
    a label feeding station configured to receive and hold the label prior to forming; and
    a label conveying station configured to move the label from the label feeding station to the first rotatable turret.

9. The system of claim 8, wherein the label conveying station comprises
    a rotatable conveying mechanism configured to rotate a plurality of arms; and
    a linear conveying mechanism,
    wherein the plurality of arms are configured to move the label from the label feeding station to the linear conveying mechanism, and
    wherein the linear conveying mechanism is configured to move the label to the first rotatable turret.

10. The system of claim 9, wherein the linear conveying mechanism comprises folding arms configured to fold the label onto said one of the forming mandrels.

11. The system of claim 1, wherein the first rotatable turret comprises an air mechanism configured to provide a burst of air to transfer the label to said one of the buffer receptacles.

12. The system of claim 1, wherein the second rotatable turret comprises an air mechanism configured to provide a burst of air to transfer the label and the container blank together to said one of the bonding stations.

13. The system of claim 1, wherein each of the plurality of bonding stations comprises
    a container-receiving mandrel configured to receive the label and the container blank; and
    a bonding receptacle configured to mate with the container-receiving mandrel having the label and the container blank.

14. The system of claim 13, wherein the bonding receptacle is configured to heat the container-receiving mandrel having the label and the container blank to bond the label to the container blank.

15. The system of claim 14, wherein the bonding receptacle is configured to receive hot oil from a hot oil manifold to bond the label to the container blank.

16. A method for labeling a container, the method comprising:
    providing a label to a label forming section comprising a first rotatable turret that includes a plurality of forming mandrels;
    forming the label in a frustoconical shape using one of the plurality of forming mandrels;
    transferring the label to a buffer section comprising a second rotatable turret that includes a plurality of buffer receptacles;
    providing a container blank to one of the buffer receptacles of the buffer section having the label provided therein;
    transferring the label and the container blank together to a bonding section comprising a third rotatable turret that includes a plurality of bonding stations; and
    bonding the label to the container blank in one of the bonding stations.

17. The method of claim 16, wherein the step of transferring the label to the buffer section comprises providing a burst of air to the label, or the step of transferring the label to the bonding section comprises providing a burst of air to the label and the container blank.

18. The method of claim 16, wherein the step of forming the label comprises
    folding the label around said one of the plurality of forming mandrels such that ends of the label overlap at an overlapping portion; and
    sealing the label at the overlapping portion.

19. The method of claim 16, wherein the step of bonding the label to the container blank comprises heating the label and the container blank in said one of the bonding stations.

20. A labeled container formed by the method of claim 16, wherein the container is a cup.

* * * * *